United States Patent
Fukuda et al.

(10) Patent No.: US 11,421,135 B2
(45) Date of Patent: Aug. 23, 2022

(54) CURABLE COMPOSITION, COATING MATERIAL, SOLAR CELL COATING MATERIAL, SOLAR CELL BACK SHEET COATING MATERIAL, ADHESIVE, SOLAR CELL ADHESIVE, SOLAR CELL BACK SHEET ADHESIVE, PRODUCING METHOD OF SHEET, AND CURING AGENT

(71) Applicant: MITSUI CHEMICALS, INC., Tokyo (JP)

(72) Inventors: Kazuyuki Fukuda, Ichihara (JP); Jun Kamada, Narashino (JP); Takashi Uchida, Chiba (JP); Hideaki Otsuka, Chiba (JP); Shinji Tachibana, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 16/093,439

(22) PCT Filed: May 18, 2017

(86) PCT No.: PCT/JP2017/018723
§ 371 (c)(1),
(2) Date: Oct. 31, 2018

(87) PCT Pub. No.: WO2017/200054
PCT Pub. Date: Nov. 23, 2017

(65) Prior Publication Data
US 2019/0211241 A1    Jul. 11, 2019

(30) Foreign Application Priority Data

May 20, 2016 (JP) .............................. JP2016-101269

(51) Int. Cl.
| | | |
|---|---|---|
| *C09J 175/04* | (2006.01) | |
| *C08G 18/75* | (2006.01) | |
| *H01L 31/04* | (2014.01) | |
| *C09J 11/04* | (2006.01) | |
| *C08G 18/80* | (2006.01) | |
| *C09D 127/12* | (2006.01) | |
| *B05D 7/24* | (2006.01) | |
| *B05D 7/04* | (2006.01) | |
| *B32B 27/30* | (2006.01) | |
| *B32B 27/40* | (2006.01) | |
| *C09D 7/40* | (2018.01) | |
| *C09J 127/12* | (2006.01) | |
| *C08G 18/38* | (2006.01) | |

(Continued)

(52) U.S. Cl.
CPC .............. *C09J 175/04* (2013.01); *B05D 7/04* (2013.01); *B05D 7/24* (2013.01); *B32B 27/30* (2013.01); *B32B 27/40* (2013.01); *C08G 18/3812* (2013.01); *C08G 18/5015* (2013.01); *C08G 18/6279* (2013.01); *C08G 18/75* (2013.01); *C08G 18/8025* (2013.01); *C08G 18/8048* (2013.01); *C08G 18/8093* (2013.01); *C09D 7/40* (2018.01); *C09D 127/12* (2013.01); *C09J 11/04* (2013.01); *C09J 127/12* (2013.01); *H01L 31/049* (2014.12); *C08G 18/289* (2013.01); *C08G 18/2865* (2013.01); *C08G 18/757* (2013.01); *C09D 175/04* (2013.01); *H01L 31/0481* (2013.01)

(58) Field of Classification Search
CPC ............ C08G 18/8025; C08G 18/8093; C08G 18/8048; C08G 18/289; C08G 18/3812; C08G 18/5015; C08G 18/6279; H01L 31/0481; H01L 31/049
See application file for complete search history.

(56) References Cited

U.S. PATENT DOCUMENTS 5,532,304 A * 7/1996 Miyazaki .............. C03C 17/009
                                                   524/261
5,849,855 A   12/1998 Usui
(Continued)

FOREIGN PATENT DOCUMENTS

| CN | 1206253 A | 1/1999 |
|---|---|---|
| CN | 102496642 A | 6/2012 |

(Continued)

OTHER PUBLICATIONS

Extended European Search Report dated Oct. 2, 2019 issued in the corresponding European patent application No. 17799478.7.
(Continued)

*Primary Examiner* — Michael L Leonard
(74) *Attorney, Agent, or Firm* — Rankin, Hill & Clark LLP

(57) ABSTRACT

A curable composition includes a blocked isocyanate in which an NCO group of an isocyanate compound having a $H_6XDI$ skeleton is blocked by a blocking agent having an O=C—CH—C=O skeleton, a curable functional group-containing fluorine polymer, and an alkoxysilane having a functional group including at least one element of a group 15 element to a group 16 element of the periodic table (excluding oxygen). In the curable composition allowing a titanium oxide to be contained, the molar ratio of the curable functional group to the NCO group is 0.5 to 10; the content ratio of the alkoxysilane with respect to 100 pans by mass of the total amount of the blocked isocyanate and the fluorine polymer is 0.2 to 8 parts by mass; and the content ratio of the titanium oxide with respect to 100 parts by mass of the fluorine polymer is 0 to 200 parts by mass.

11 Claims, No Drawings

(51) Int. Cl.
  *C08G 18/50* (2006.01)
  *H01L 31/049* (2014.01)
  *C08G 18/62* (2006.01)
  *C08G 18/28* (2006.01)
  *C09D 175/04* (2006.01)
  *H01L 31/048* (2014.01)

(56) References Cited

U.S. PATENT DOCUMENTS

| | | |
|---|---|---|
| 6,583,216 B1 | 6/2003 | König et al. |
| 2003/0032719 A1 | 2/2003 | Sapper |
| 2004/0132888 A1 | 7/2004 | Naiki |
| 2006/0276611 A1 | 12/2006 | Katamura |
| 2008/0033086 A1 | 2/2008 | Jimenez |
| 2009/0306284 A1 | 12/2009 | Reiners |
| 2011/0083726 A1* | 4/2011 | Takayanagi et al. ... C08L 27/12 136/251 |
| 2011/0313101 A1 | 12/2011 | Morikami |
| 2013/0202786 A1* | 8/2013 | Hara ............... C08G 18/6279 427/162 |
| 2014/0124017 A1* | 5/2014 | Akaike et al. ...... H01L 31/0481 136/251 |
| 2014/0290743 A1 | 10/2014 | Nakagawa |
| 2014/0318617 A1* | 10/2014 | Nakagawa ......... C08G 18/6279 136/256 |
| 2014/0338733 A1* | 11/2014 | Takegami ............. H01L 31/049 136/251 |
| 2015/0086792 A1* | 3/2015 | Zheng ................. C09D 127/16 428/421 |
| 2017/0029555 A1 | 2/2017 | Hamajima |

FOREIGN PATENT DOCUMENTS

| | | |
|---|---|---|
| CN | 103119110 A | 5/2013 |
| CN | 103477444 A | 12/2013 |
| CN | 103890969 A | 6/2014 |
| JP | H04106117 A | 4/1992 |
| JP | H07176775 A | 7/1995 |
| JP | 2001152007 A | 6/2001 |
| JP | 3547197 B2 | 7/2004 |
| JP | 2004211064 A | 7/2004 |
| JP | 2004214342 A | 7/2004 |
| JP | 3712295 B2 | 11/2005 |
| JP | 2006335954 A | 12/2006 |
| JP | 2009155408 A | 7/2009 |
| JP | 2010122374 A | 6/2010 |
| JP | 5191733 B2 | 5/2013 |
| JP | 2013136736 A | 7/2013 |
| JP | 5527867 B2 | 6/2014 |
| JP | 5652955 B2 | 1/2015 |
| JP | 2015007239 A | 1/2015 |
| JP | 5778647 B2 | 9/2015 |
| JP | 2015199887 A | 11/2015 |
| WO | 0157109 A1 | 8/2001 |
| WO | 2006024885 A1 | 3/2006 |
| WO | 2007071323 A1 | 6/2007 |
| WO | 2009157449 A1 | 12/2009 |
| WO | 2013065851 A1 | 5/2013 |

OTHER PUBLICATIONS

International Search Report dated Jul. 18, 2017 filed in PCT/JP2017/018723.

PCT International Preliminary Reporton Patentability (Form PCT/IB/373) filed in PCT/JP2017/018723, with PCT Notification Concerning Transmittal of International Preliminary Report on Patentability (Form PCT/IB/326) dated Nov. 20, 2018.

PCT International Preliminary Reporton Patentability (Form PCT/IB/373)filed in PCT/JP2017/018723, with PCT Notification of Transmillal of Translation of the International Preliminary Report on Patentability (Form PCT/IB/338) dated Nov. 20, 2018.

* cited by examiner

CURABLE COMPOSITION, COATING MATERIAL, SOLAR CELL COATING MATERIAL, SOLAR CELL BACK SHEET COATING MATERIAL, ADHESIVE, SOLAR CELL ADHESIVE, SOLAR CELL BACK SHEET ADHESIVE, PRODUCING METHOD OF SHEET, AND CURING AGENT

TECHNICAL FIELD

The present invention relates to a curable composition, a coating material, a solar cell coating material, a solar cell back sheet coating material, an adhesive, a solar cell adhesive, a solar cell back sheet adhesive, a producing method of a sheet, and a curing agent, to be specific, to a curable composition, a coating material containing the curable composition, a solar cell coating material containing the curable composition, a solar cell back sheet coating material containing the curable composition, an adhesive containing the curable composition, a solar cell adhesive containing the curable composition, a solar cell back sheet adhesive containing the curable composition, a method for producing a sheet using the coating material, and furthermore, a curing agent.

BACKGROUND ART

A solar cell module usually includes a front-face layer, a sealing material layer that seals a solar cell, and a back sheet.

The back sheet is, for example, required to have various properties such as mechanical strength, weather resistance, electric insulating properties, and water-proof and moisture-proof properties. To satisfy such a requirement, for example, a multi-layered structure back sheet laminated with a weather resistance layer, an electric insulating layer, and a water-proof and moisture-proof layer has been known.

In the back sheet, each layer is usually formed of a resin sheet or the like, and it has been recently considered that a curing coating film of a resin composition is used instead of the resin sheet.

To be specific, for example, a coating material containing a curable functional group-containing fluorine polymer and a blocked isocyanate based on a hexamethylene diisocyanate has been known, and also, it has been proposed that the curing coating film of the coating material is used in the back sheet of the solar cell module. To be more specific, it has been proposed that after mixing a curable TFE (tetrafluoroethylene) copolymer, a titanium oxide as a white pigment, and a butyl acetate, as a curing agent, an active methylene compound blocked isocyanate of HDI (hexamethylene diisocyanate) is blended thereto, thereby obtaining a coating material (ref: for example, the following Patent Document 1 (Preparation Example 1)).

CITATION LIST

Patent Document

Patent Document 1: Japanese Unexamined Patent Publication No. 2013-136736

SUMMARY OF THE INVENTION

Problem to be Solved by the Invention

Meanwhile, according to consideration of the inventors, as described in the above-described Patent Document 1, a defect of poor glossiness of the coating film containing the curable functional group-containing fluorine polymer or the like is found. Thus, in the use requiring glossiness, it is considered that the curing coating film of the coating material described in the above-described Patent Document 1 needs to be improved.

The coating material is required to have storage stability, and the curing coating film of the coating material is further required to have solvent resistance, adhesive properties, low yellowing degree (low b value), or the like in accordance with the use.

An object of the present invention is to provide a curable composition that is capable of obtaining a curing coating film having excellent glossiness and furthermore, having excellent solvent resistance, adhesive properties, and low yellowing degree (low b value) and has excellent storage stability; a coating material containing the curable composition, a solar cell coating material containing the curable composition, a solar cell back sheet coating material containing the curable composition, an adhesive containing the curable composition, a solar cell adhesive containing the curable composition, a solar cell back sheet adhesive containing the curable composition, a method for producing a sheet using the coating material, and furthermore, a curing agent.

Means for Solving the Problem

The present invention [1] includes a curable composition containing a blocked isocyanate, a curable functional group-containing fluorine polymer, and an alkoxysilane as essential components and a titanium oxide as an arbitrary component, wherein the blocked isocyanate includes a blocked isocyanate in which an isocyanate group of an isocyanate compound having a bis(isocyanatomethyl)cyclohexane skeleton is blocked by a blocking agent having an O═C—CH—C═O skeleton; the alkoxysilane has a functional group including at least one kind of element selected from the group consisting of a group 15 element to a group 16 element of the periodic table (excluding oxygen); the molar ratio (curable functional group/isocyanate group) of the curable functional group of the curable functional group-containing fluorine polymer to the isocyanate group of the isocyanate compound in the blocked isocyanate is 0.5 to 10; the content ratio of the alkoxysilane with respect to 100 parts by mass of the total amount of the blocked isocyanate and the curable functional group-containing fluorine polymer is 0.2 to 8 parts by mass; and the content ratio of the titanium oxide with respect to 100 parts by mass of the curable functional group-containing fluorine polymer is 0 to 200 parts by mass.

The present invention [2] includes the curable composition described in the above-described [1], wherein the blocking agent is a malonic acid ester derivative and/or an acetoacetic acid ester derivative.

The present invention [3] includes the curable composition described in the above-described [1] or [2], wherein the functional group of the alkoxysilane is at least one kind of functional group selected from the group consisting of primary amino group, secondary amino group, and mercapto group.

The present invention [4] includes a coating material containing the curable composition described in any one of the above-described [1] to [3].

The present invention [5] includes a solar cell coating material containing the curable composition described in any one of the above-described [1] to [3].

The present invention [6] includes a solar cell back sheet coating material containing the curable composition described in any one of the above-described [1] to [3].

The present invention [7] includes an adhesive containing the curable composition described in any one of the above-described [1] to [3].

The present invention [8] includes a solar cell adhesive containing the curable composition described in any one of the above-described [1] to [3].

The present invention [9] includes a solar cell back sheet adhesive containing the curable composition described in any one of the above-described [1] to [3].

The present invention [10] includes a method for producing a sheet including the steps of applying the coating material described in the above-described [4] to a substrate and curing the coating material.

The present invention [11] includes a curing agent of a curable functional group-containing fluorine polymer including a blocked isocyanate having an isocyanate group of an isocyanate compound having a bis(isocyanatomethyl) cyclohexane skeleton blocked by a blocking agent having an O=C—CH—C=O skeleton.

Effect of the Invention

According to the curable composition, the coating material, the solar cell coating material, the solar cell back sheet coating material, the adhesive, the solar cell adhesive, the solar cell back sheet adhesive, and the curing agent of the present invention, a curing coating film having excellent glossiness and furthermore, having excellent solvent resistance, adhesive properties, and low yellowing degree (low b value) can be obtained, and excellent storage stability can be achieved.

According to the method for producing a sheet of the present invention, the sheet made of the curing coating film having excellent glossiness and furthermore, having excellent solvent resistance, adhesive properties, and low yellowing degree (low h value) can be obtained.

DESCRIPTION OF EMBODIMENTS

A curable composition of the present invention contains a blocked isocyanate, a curable functional group-containing fluorine polymer, and an alkoxysilane as essential components.

The blocked isocyanate is a curing agent of a curable functional group-containing fluorine polymer (that is, a curing agent with the curable functional group-containing fluorine polymer as a main agent), and a reaction product of an isocyanate component and a blocking agent.

The isocyanate component contains an isocyanate compound having bis(isocyanatomethyl)cyclohexane ($H_6XDI$) skeleton as an essential component.

An example of the isocyanate compound having a bis(isocyanatomethyl)cyclohexane skeleton includes a bis(isocyanatomethyl)cyclohexane (monomer), and to be specific, examples thereof include 1,2-bis(isocyanatomethyl)cyclohexane, 1,3-bis(isocyanatomethyl)cyclohexane, and 1,4-bis(isocyanatomethyl)cyclohexane. These may have a known substituent as long as it does not damage the excellent effect of the present invention.

These bis(isocyanatomethyl)cyclohexanes can be used alone or in combination of two or more. By using the bis(isocyanatomethyl)cyclohexanes in combination of two or more, a melting point and a glass transition temperature can be adjusted.

As the bis(isocyanatomethyl)cyclohexane, preferably, a 1,3-bis(isocyanatomethyl)cyclohexane and a 1,4-bis(isocyanatomethyl)cyclohexane are used, more preferably, a 1,3-bis(isocyanatomethyl)cyclohexane is used.

A geometrical isomer (cis-isomer and trans-isomer) is present in the bis(isocyanatomethyl)cyclohexane.

The content ratio of the trans-isomer in the bis(isocyanatomethyl)cyclohexane is, for example, in view of increase of the melting point for the purpose of increase of heat resistance, preferably 50 mol % or more, more preferably 70 mol % or more, further more preferably 80 mol % or more, particularly preferably 85 mol % or more, and preferably, 100 mol % or less, more preferably 96 mol % or less, further more preferably 93 mol % or less.

The content ratio of the trans-isomer can be obtained by analysis with a gas chromatograph.

An example of the isocyanate compound having a bis(isocyanatomethyl)cyclohexane skeleton includes a derivative of the bis(isocyanatomethyl)cyclohexane in addition to the above-described bis(isocyanatomethyl)cyclohexane (monomer).

To be specific, examples thereof include multimers of the above-described bis(isocyanatomethyl)cyclohexane (for example, dimer, trimer (for example, isocyanurate derivative, iminooxadiazinedione derivative), pentamer, heptamer, or the like); allophanate derivatives of the above-described bis(isocyanatomethyl)cyclohexane (for example, allophanate derivative or the like produced by reaction of the above-described bis(isocyanatomethyl)cyclohexane with a low molecular weight polyol); polyol derivatives of the above-described bis(isocyanatomethyl)cyclohexane (for example, polyol derivative (alcohol adduct) or the like produced by reaction of the above-described bis(isocyanatomethyl)cyclohexane with a low molecular weight polyol); biuret derivatives of the above-described bis(isocyanatomethyl)cyclohexane (for example, biuret derivative or the like produced by reaction of the above-described bis(isocyanatomethyl)cyclohexane with water and amines); urea derivatives of the above-described bis(isocyanatomethyl)cyclohexane (for example, urea derivative or the like produced by reaction of the above-described bis(isocyanatomethyl)cyclohexane with a diamine); oxadiazine trione derivatives of the above-described bis(isocyanatomethyl)cyclohexane (for example, oxadiazine trione or the like produced by reaction of the above-described bis(isocyanatomethyl)cyclohexane with a carbon dioxide gas; carbodiimide derivatives of the above-described bis(isocyanatomethyl)cyclohexane (carbodiimide derivative or the like produced by decarboxylation condensation reaction of the above-described bis(isocyanatomethyl)cyclohexane); uretdione derivatives; and uretonimine derivatives. These may have a known substituent as long as it does not damage the excellent effect of the present invention.

These derivatives of the bis(isocyanatomethyl)cyclohexane can be used alone or in combination of two or more.

As the derivative of the bis(isocyanatomethyl)cyclohexane, preferably, a multimer of the bis(isocyanatomethyl)cyclohexane is used, more preferably, a trimer of the bis(isocyanatomethyl)cyclohexane is used, particularly preferably, an isocyanurate derivative of the bis(isocyanatomethyl)cyclohexane is used.

These isocyanate compounds having a bis(isocyanatomethyl)cyclohexane skeleton can be used alone or in combination of two or more.

As the isocyanate compound having a bis(isocyanatomethyl)cyclohexane skeleton, preferably, a derivative of the bis(isocyanatomethyl)cyclohexane is used, more preferably, a multimer of the bis(isocyanatomethyl)cyclohexane is used, further more preferably, a trimer of the bis(isocyanatomethyl)cyclohexane is used, particularly preferably, an isocyanurate derivative of the bis(isocyanatomethyl)cyclohexane is used.

The isocyanate component can contain an isocyanate compound without having a bis(isocyanatomethyl)cyclohexane skeleton as an arbitrary component.

Examples of the isocyanate compound without having a bis(isocyanatomethyl)cyclohexane skeleton include polyisocyanate monomers such as aromatic polyisocyanate, araliphatic polyisocyanate, aliphatic polyisocyanate, and alicyclic polyisocyanate (excluding the bis(isocyanatomethyl)cyclohexane (hereinafter, the same)).

Examples of the aromatic polyisocyanate include aromatic diisocyanates such as tolylene diisocyanate (2,4- or 2,6-tolylene diisocyanate or a mixture thereof) (TDI), phenylene diisocyanate (m-, p-phenylene diisocyanate or a mixture thereof), 4,4'-diphenyl diisocyanate, 1,5-naphthalene diisocyanate (NDI), diphenylmethane diisocyanate (4,4'-, 2,4'-, or 2,2'-diphenylmethane diisocyanate or a mixture thereof) (MDI), 4,4'-toluidine diisocyanate (TOM), and 4,4'-diphenylether diisocyanate.

Examples of the araliphatic polyisocyanate include araliphatic diisocyanates such as xylylene diisocyanate (1,3- or 1,4-xylylene diisocyanate or a mixture thereof) (XDI), tetramethylxylylene diisocyanate (1,3- or 1,4-tetramethylxylylene diisocyanate or a mixture thereof) (TMXDI), and ω,ω'-diisocyanate-1,4-diethylbenzene.

Examples of the aliphatic polyisocyanate include aliphatic diisocyanates such as trimethylene diisocyanate, 1,2-propylene diisocyanate, butylene diisocyanate (tetramethylene diisocyanate, 1,2-butylene diisocyanate, 2,3-butylene diisocyanate, and 1,3-butylene diisocyanate), 1,5-pentamethylene diisocyanate (PDI), 1,6-hexamethylene diisocyanate (HDI), 2,4,4- or 2,2,4-trimethylhexamethylene diisocyanate, and 2,6-diisocyanatemethylcaproate.

Examples of the alicyclic polyisocyanate (excluding the bis(isocyanatomethyl)cyclohexane) include alicyclic diisocyanates such as 1,3-cyclopentane diisocyanate, 1,3-cyclopentene diisocyanate, cyclohexane diisocyanate (1,4-cyclohexane diisocyanate, 1,3-cyclohexane diisocyanate), 3-isocyanatomethyl-3,5,5-trimethylcyclohexyl isocyanate (isophorone diisocyanate) (IPDI), methylene bis(cyclohexyl isocyanate) (4,4'-, 2,4'-, or 2,2'-methylene bis(cyclohexyl isocyanate, trans-trans isomer thereof, trans-cis isomer thereof, cis-cis isomer thereof, or a mixture thereof)) ($H_{12}$MDI), methylcyclohexane diisocyanate (methyl-2,4-cyclohexane diisocyanate, methyl-2,6-cyclohexane diisocyanate), and norbornane diisocyanate (various isomers or a mixture thereof) (NBDI).

These polyisocyanate monomers can be used alone or in combination of two or more.

As the polyisocyanate monomer, in view of increase of balance with weather resistance or the like, preferably, an aliphatic polyisocyanate is used, more preferably, a 1,5-pentamethylene diisocyanate (PDI) and a 1,6-hexamethylene diisocyanate (HDI) are used, and in view of easy availability and cost, further more preferably, a 1,6-hexamethylene diisocyanate (HDI) is used.

As the isocyanate compound without having a bis(isocyanatomethyl)cyclohexane skeleton, in addition to the above-described polyisocyanate monomer, a polyisocyanate derivative (excluding the bis(isocyanatomethyl)cyclohexane derivative (hereinafter, the same)) is also used.

Examples of the polyisocyanate derivative include multimers of the above-described polyisocyanate monomer (for example, dimer, trimer (for example, isocyanurate derivative, iminooxadiazinedione derivative), pentamer, heptamer, or the like); allophanate derivatives of the above-described polyisocyanate monomer (for example, allophanate derivative or the like produced by reaction of the above-described polyisocyanate monomer with a known low molecular weight polyol); polyol derivatives of the above-described polyisocyanate monomer (for example, polyol derivative (alcohol adduct) or the like produced by reaction of the polyisocyanate monomer with a known low molecular weight polyol); biuret derivatives of the above-described polyisocyanate monomer (for example, biuret derivative or the like produced by reaction of the above-described polyisocyanate monomer, water, and amines); urea derivatives of the above-described polyisocyanate monomer (for example, urea derivative or the like produced by reaction of the above-described polyisocyanate monomer with diamine); oxadiazinetrione derivatives of the above-described polyisocyanate monomer (for example, oxadiazinetrione or the like produced by reaction of the above-described polyisocyanate monomer with the carbonic acid gas); carbodiimide derivatives of the above-described polyisocyanate monomer (for example, carbodiimide derivative or the like produced by decarboxylation condensation reaction of the above-described polyisocyanate monomer); uretdione derivatives; and uretonimine derivatives. Furthermore, an example of the polyisocyanate derivative includes polymethylene polyphenyl polyisocyanate (crude MDI, polymeric MDI).

These polyisocyanate derivatives can be used alone or in combination of two or more.

As the polyisocyanate derivative, preferably, a multimer of the polyisocyanate monomer is used, further more preferably, a trimer of the polyisocyanate monomer is used, particularly preferably, an isocyanurate derivative of the polyisocyanate monomer is used.

These isocyanate compounds without having a bis(isocyanatomethyl)cyclohexane skeleton can be used alone or in combination of two or more.

As the isocyanate compound without having a bis(isocyanatomethyl)cyclohexane skeleton, preferably, a polyisocyanate derivative is used, more preferably, a multimer of the polyisocyanate monomer is used, further more preferably, a trimer of the polyisocyanate monomer is used, particularly preferably, an isocyanurate derivative of the polyisocyanate monomer is used.

The content ratio of the isocyanate compound without having a bis(isocyanatomethyl)cyclohexane skeleton with respect to the total amount of the isocyanate component is, for example, 80 mass % or less, preferably 50 mass % or less, more preferably 20 mass % or less, further more preferably 10 mass % or less, particularly preferably 5 mass % or less, and usually 0 mass % or more. The content ratio of the isocyanate compound having a bis(isocyanatomethyl)cyclohexane skeleton with respect to the total amount of the isocyanate component is, for example, 20 mass % or more, preferably 50 mass % or more, more preferably 80 mass % or more, further more preferably 90 mass % or more, particularly preferably 95 mass % or more, and usually 100 mass % or less.

In view of glossiness and solvent resistance, the isocyanate component preferably does not contain the isocyanate compound without having a bis(isocyanatomethyl)cyclohexane skeleton and contains the isocyanate compound having a bis(isocyanatomethyl)cyclohexane skeleton alone.

In view of low yellowing degree, the isocyanate component preferably contains the isocyanate compound having a bis(isocyanatomethyl)cyclohexane skeleton and the isocyanate compound without having a bis(isocyanatomethyl)cyclohexane skeleton (more preferably, an aliphatic polyisocyanate and a derivative thereof).

When two types or more of the isocyanate compounds are used in combination (for example, when the isocyanate compound having a bis(isocyanatomethyl)cyclohexane skeleton and the isocyanate compound without having a bis(isocyanatomethyl)cyclohexane skeleton are used in combination), for example, at the time of producing a blocked isocyanate (described later), two types or more of the polyisocyanate compounds may simultaneously react with a blocking agent (described later), or each of the polyisocyanate compounds may individually react with the blocking agent (described later) and each of the blocked isocyanates thus obtained may be mixed.

The blocking agent contains a blocking agent having an O=C—CH—C=O skeleton as an essential component. The O=C—CH—C=O skeleton represents an active methylene skeleton and/or an active methine skeleton.

Examples of the blocking agent having an O=C—CH—C=O skeleton include an active methylene compound and an active methine compound and to be specific, examples thereof include malonic ester derivatives such as dialkyl malonate (for example, dimethyl malonate, diethyl malonate, dipropyl malonate, di-n-butyl malonate, di-t-butyl malonate, di-2-ethyl hexyl malonate, methyl-n-butyl malonate, ethyl-n-butyl malonate, methyl-s-butyl malonate, ethyl-s-butyl malonate, methyl-t-butyl malonate, ethyl-t-butyl malonate, diethyl methylmalonate, dibenzyl malonate, diphenyl malonate, benzylmethyl malonate, ethylphenyl malonate, t-butylphenyl malonate, isopropylidene malonate, or the like), and monosubstituted malonic ester (for example, ethyl methylmalonate, ethyl ethylmalonate, or the like); acetoacetic ester derivatives such as alkyl acetoacetate (for example, methyl acetoacetate, ethyl acetoacetate, n-propyl acetoacetate, isopropyl acetoacetate, n-butyl acetoacetate, t-butyl acetoacetate, benzyl acetoacetate, phenyl acetoacetate, or the like); 2-acetoacetoxy ethyl methacrylate; acetylacetone; ethyl cyanoacetate; and meldrum's acid.

These blocking agents having an O=C—CH—C=O skeleton can be used alone or in combination of two or more.

As the blocking agent having an O=C—CH—C=O skeleton, preferably, a malonic ester derivative and an acetoacetic ester derivative are used, more preferably, a malonic ester derivative is used.

When the blocking agent having an O=C—CH—C=O skeleton is used, a curing coating film having excellent glossiness and furthermore, having excellent solvent resistance, adhesive properties, and low yellowing degree (low b value) can be easily obtained, and a curable composition having excellent storage stability tends to be easily obtained.

As the blocking agent having an O=C—CH—C=O skeleton, further more preferably, diethyl malonate and ethyl acetoacetate are used, particularly preferably, diethyl malonate is used.

The blocking agent can contain a blocking agent without having an O=C—CH—C=O skeleton as an arbitrary component.

Examples of the blocking agent without having an O=C—CH—C=O skeleton include imidazole compound, imidazoline compound, pyrimidine compound, guanidine compound, alcohol compound, phenol compound, amine compound, imine compound, oxime compound, carbamic acid compound, urea compound, acid amide (lactam) compound, acid imide compound, triazole compound, pyrazole compound, mercaptan compound, and bisulfate.

These blocking agents without having an O=C—CH—C=O skeleton can be used alone or in combination of two or more.

The content ratio of the blocking agent without having an O=C—CH—C=O skeleton with respect to the total amount of the blocking agent is, for example, 80 mass % or less, preferably 50 mass % or less, more preferably 20 mass % or less, further more preferably 10 mass % or less, particularly preferably 5 mass % or less, and usually 0 mass % or more. The content ratio of the blocking agent having an O=C—CH—C=O skeleton with respect to the total amount of the blocking agent is, for example, 20 mass % or more, preferably 50 mass % or more, more preferably 80 mass % or more, further more preferably 90 mass % or more, particularly preferably 95 mass % or more, and usually 100 mass % or less.

The blocking agent preferably does not contain the blocking agent without having an O=C—CH—C=O skeleton, and contains the blocking agent having an O=C—CH—C=O skeleton alone.

The above-described isocyanate component reacts with the above-described blocking agent, so that a blocked isocyanate is obtained as a reaction product of the above-described isocyanate component with the above-described blocking agent.

As the mixing ratio of the above-described isocyanate component to the above-described blocking agent, the equivalent ratio (active group/isocyanate group) of the active group (that is, a blocking group) that reacts with the isocyanate group in the blocking agent to the isocyanate group of the isocyanate component is, for example, 0.2 or more, preferably 0.5 or more, more preferably 0.8 or more, and for example, 1.5 or less, preferably 1.2 or less, more preferably 1.1 or less.

As the reaction conditions, for example, the reaction temperature is, for example, 0° C. or more, preferably 20° C. or more, and for example, 100° C. or less, preferably 80° C. or less, more preferably 70° C. or less under, for example, an atmospheric pressure under an inert gas (for example, nitrogen gas, argon gas, or the like) atmosphere. The reaction time is, for example, 0.5 hours or more, preferably 1.0 hour or more, and for example, 24 hours or less, preferably 12 hours or less.

The termination of the reaction can be, for example, judged by confirming a disappearance or a decrease of the isocyanate group by using an infrared spectroscopic analyzing method or the like.

Each of the reactions described above may be, for example, performed in the absence of solvent or under the presence of solvent.

Examples of the solvent include ketones such as acetone, methyl ethyl ketone, methyl isobutyl ketone, and cyclohexanone; nitriles such as acetonitrile; alkyl esters such as methyl acetate, ethyl acetate, butyl acetate, and isobutyl acetate; aliphatic hydrocarbons such as n-hexane, n-heptane, and octane; alicyclic hydrocarbons such as cyclohexane and methyl cyclohexane; aromatic hydrocarbons such as toluene, xylene, and ethyl benzene; glycol ether esters such as methyl cellosolve acetate, ethyl cellosolve acetate, methyl carbitol acetate, ethyl carbitol acetate, ethylene glycol ethyl ether acetate, propylene glycol methyl ether acetate, 3-methyl-3-methoxybutylacetate, and ethyl-3-ethoxypropionate; ethers such as diethyl ether, tetrahydrofuran, dioxane, 1,2-dimethoxyethane, diethylene glycol dimethyl ether, diethylene glycol diethyl ether, dipropylene glycol dimethyl ether, and dipropylene glycol diethyl ether; halogenated aliphatic hydrocarbons such as methyl chloride, methylene chloride, chloroform, carbon tetrachloride, methyl bromide, methylene iodide, and dichloroethane; aprotic polar solvents such as N-methyl pyrrolidone, dimethyl formamide, N,N'-dimethylacetamide, dimethyl sulfoxide, and hexamethylphosphonylamide; and furthermore, propyleneglycol-1-monomethylether-2-acetate. These solvents can be used alone or in combination of two or more.

In each of the reactions described above, a blocking reaction catalyst can be added as needed.

Examples of the blocking reaction catalyst include basic compounds and to be specific, examples thereof include alkali metal alcoholates such as sodium methylate, sodium ethylate, sodium phenolate, and potassium methylate; hydroxides of tetraalkylammonium such as tetramethylammonium, tetraethylammonium, and tetrabutylammonium; organic weak acid salts such as acetate, octyl acid salt, myristic acid salt, and benzoic acid salt of tetraalkylammonium; alkali metal salt of alkyl carboxylic acid such as acetic acid, caproic acid, octylic acid, and myristic acid; metal salts such as tin, zinc, and lead of the above-described alkyl carboxylic acid; aminosilyl group-containing compounds such as hexamethylene disilazane; and hydroxides of alkali metal such as lithium, sodium, and potassium. The blocking reaction catalyst can be also used as a solution obtained by being dissolved in the above-described solvent as needed.

These blocking reaction catalysts can be used alone or in combination of two or more.

As the blocking reaction catalyst, preferably, an alkali metal alcoholate is used, more preferably, a sodium methylate is used.

The mixing ratio of the blocking reaction catalyst is not particularly limited, and the mixing ratio thereof with respect to 100 parts by mass of the isocyanate component is, for example, 0.01 parts by mass or more, preferably 0.05 parts by mass or more, more preferably 0.1 parts by mass or more, and for example, 5 parts by mass or less, preferably 3 parts by mass or less, more preferably 2 parts by mass or less.

The blocked isocyanate is obtained as, for example, a nonaqueous dispersion blocked isocyanate, and can be, for example, used by being dissolved in the above-described solvent.

When the blocked isocyanate is dissolved in the solvent, the concentration of the solid content thereof is, for example, 1 mass % or more, preferably 20 mass % or more, more preferably 30 mass % or more, and for example, 95 mass % or less, preferably 90 mass % or less.

The isocyanate component reacts with the blocking agent as described above, so that an isocyanate group of the isocyanate component is blocked by a blocking group of the blocking agent, thereby obtaining the blocked isocyanate.

In the blocked isocyanate, the isocyanate group is blocked by the blocking agent, so that an excellent pot life can be ensured by being used as a curing agent in the curable composition. Although the details are described later, when the above-described blocked isocyanate is used, a curing coating film having excellent glossiness and furthermore, having excellent solvent resistance, adhesive properties, and low yellowing degree (low b value) can be obtained.

In the curable composition, the content ratio of the blocked isocyanate is appropriately adjusted so as to be within a range to be described later.

The curable functional group-containing fluorine polymer is a main agent with the blocked isocyanate used as a curing agent, and a fluorine polymer having a functional group (curable functional group) that cures the curable composition.

The curable functional group is a functional group having activity with respect to the blocking agent that blocks the isocyanate group and/or activity with respect to the isocyanate group.

To be specific, examples of the curable functional group include hydroxyl group (excluding the hydroxyl group contained in the carboxyl group (hereinafter, the same)), carboxyl group, —COOCO— group, cyano group, amino group, glycidyl group, silyl group, silanol group, and isocyante group. These curable functional groups can be used alone or in combination of two or more.

As the curable functional group, in view of curing reactivity, preferably, a hydroxyl group, a carboxyl group, a —COOCO— group, a cyano group, an amino group, and a silyl group are used, more preferably, a hydroxyl group, a carboxyl group, an amino group, and a silyl group are used, in view of easy availability, further more preferably, a hydroxyl group and a carboxyl group are used, particularly preferably, a hydroxyl group is used.

The curable functional group-containing fluorine polymer is, for example, a copolymer of a monomer containing fluorine that is capable of forming a fluorine polymer by homopolymerization (hereinafter, referred to as a fluorine-containing polymerizable monomer) with a monomer that is copolymerizable with the fluorine-containing polymerizable monomer and contains the above-described curable functional group (hereinafter, referred to as a curable functional group-containing copolymerizable monomer).

In other words, in the curable functional group-containing fluorine polymer, the curable functional group derived from the curable functional group-containing copolymerizable monomer is introduced into a fluorine polymer (base polymer) obtained by polymerization of the fluorine-containing polymerizable monomer.

Examples of the fluorine-containing polymerizable monomer include tetrafluoroethylene (TFE), chlorotrifluoroethylene (CTFE), vinylidene fluoride (VdF), vinyl fluoride (VF), fluoroalkyl (meth)acrylate (AFAE), fluorovinyl ether, hexafluoropropylene (HFP), and per fluoro(alkyl vinyl ether) (PAVE).

These fluorine-containing polymerizable monomers can be used alone or in combination of two or more.

As the fluorine-containing polymerizable monomer, preferably, tetrafluoroethylene, chlorotrifluoroethylene, and vinylidene fluoride are used, more preferably, tetrafluoroethylene and chlorotrifluoroethylene are used.

Examples of the curable functional group-containing copolymerizable monomer include hydroxyl group-containing copolymerizable monomer, carboxyl group-containing copolymerizable monomer, —COOCO-group-containing copolymerizable monomer, cyano group-containing copolymerizable monomer, amino group-containing copolymerizable monomer, glycidyl group-containing copolymerizable monomer, silyl group-containing copolymerizable monomer, silanate group-containing copolymerizable monomer, and isocyanate group-containing copolymerizable monomer. Preferably, a hydroxyl group-containing copolymerizable monomer, a carboxyl group-containing copolylmerizable monomer, an amino group-containing copolymerizable monomer, and a silyl group-containing copolymerizable monomer are used.

Example of the hydroxyl group-containing copolymerizable monomer include hydroxyl group-containing vinyl ethers such as 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether; hydroxyl group-containing allyl ethers such as 2-hydroxyethyl allyl ether, 4-hydroxybutyl allyl ether, and glycerol monoallyl ether; and hydroxyalkyl esters of (meth)acrylic acid such as 2-hydroxyethyl acrylate and 2-hydroxyethyl methacrylate.

These hydroxyl group-containing copolymerizable monomers can be used alone or in combination of two or more.

As the hydroxyl group-containing copolymerizable monomer, in view of polymerization reactivity and reaction curability, preferably, hydroxyl group-containing vinyl ethers are used, more preferably, a 4-hydroxybutyl vinyl ether and a 2-hydroxyethyl vinyl ether are used.

Examples of the carboxyl group-containing copolymerizable monomer include acrylic acid, methacrylic acid, vinyl acetate, crotonic acid, cinnamic acid, 3-allyloxy propionic acid, 3-(2-allyloxyethoxycarbonyl)propionic acid, itaconic acid, itaconic acid monoester, maleic acid, maleic acid monoester, maleic anhydride, fumaric acid, fumaric acid monoester, vinyl phthalate, pyromellitic acid vinyl, 3-(2-allyloxyethoxycarbonyl)propionic acid, 3-(2-allyloxybutoxycarbonyl)propionic acid, 3-(2-vinyloxyethoxycarbonyl) propionic acid, and 3-(2-vinyloxybutoxycarbonyl)propionic acid.

These carboxyl group-containing copolymerizable monomers can be used alone or in combination of two or more.

As the carboxyl group-containing copolymerizable monomer, in view of suppression of the production of a homopolymer, preferably, a crotonic acid, an itaconic acid, a maleic acid, a maleic acid monoester, a fumaric acid, a fumaric acid monoester, and a 3-allyloxy propionic acid are used.

Examples of the amino group-containing copolymerizable monomer include amino vinyl ethers represented by $CH_2=CH-O-(CH_2)_x-NH_2$ (x=0 to 10), allylamines represented by $CH_2=CH-O-CO(CH_2)_x-NH_2$ (x=1 to 10), aminomethylstyrene, vinylamine, acrylamide, vinylacetoamide, and vinylformamide.

These amino group-containing copolymerizable monomers can be used alone or in combination of two or more.

An example of the silyl group-containing copolymerizable monomer includes a silicone vinyl monomer. Examples of the silicone vinyl monomer include (meth)acrylic esters such as $CH_2=CHCO_2(CH_2)_3Si(OCH_3)_3$, $CH_2=CHCO_2(CH_2)_3Si(OC_2H_5)_3$, $CH_2=C(CH_3)CO_2(CH_2)_3Si(OCH_3)_3$, $CH_2=C(CH_3)CO_2(CH_2)_3Si(OC_2H_5)_3$, $CH_2=CHCO_2(CH_2)_3SiCH_3(OC_2H_5)_2$, $CH_2=C(CH_3)CO_2(CH_2)_3SiC_2H_5(OCH_3)_2$, $CH_2=C(CH_3)CO_2(CH_2)_3Si(CH_3)_2(OC_2H_5)$, $CH_2=C(CH_3)CO_2(CH_2)_3Si(CH_3)_2OH$, $CH_2=CH(CH_2)_3Si(OCOCH_3)_3$, $CH_2=C(CH_3)CO_2(CH_2)_3SiC_2H_5(OCOCH_3)_2$, $CH_2=C(CH_3)CO_2(CH_2)_3SiCH_3(N(CH_4)COCH_3)_2$, $CH_2=CHCO_2(CH_2)_3SiCH_3[ON(CH_3)C_2H_5]_2$, and $CH_2=C(CH_3)CO_2(CH_2)_3SiC6H_5[ON(CH_3)C_2H_5]_2$; vinylsilanes such as $CH_2=CHSi[ON=C(CH_3)(C_2H_5)]_3$, $CH_2=CHSi(OCH_3)_3$, $CH_2=CHSi(OC_2H_5)_3$, $CH_2=CHSiCH_3(OCH_3)_2$, $CH_2=CHSi(OCOCH_3)_3$, $CH_2=CHSi(CH_3)_2(OC_2H_5)$, $CH_2=CHSi(CH_3)_2SiCH_3(OCH_3)_2$, $CH_2=CHSiC_2H_5(OCOCH_3)_2$, $CH_2=CHSiCH_3[ON(CH_3)C_2H_5]_2$, and vinyltrichlorosilane or partial hydrolysate thereof; and vinyl ethers such as trimethoxysilyl ethyl vinyl ether, triethoxysilyl ethyl vinyl ether, trimethoxysilyl butyl vinyl ether, methyldimethoxysilyl ethyl vinyl ether, trimethoxysilyl propyl vinyl ether, and triethoxysilyl propyl vinyl ether.

These silyl group-containing copolymerizable monomers can be used alone or in combination of two or more.

As the silyl group-containing copolymerizable monomer, preferably, a silicone vinyl monomer is used.

Furthermore, the curable functional group-containing fluorine polymer may contain another monomer as a material component. Examples of the monomer include vinyl esters of a carboxylic acid such as vinyl acetate, vinyl propionate, vinyl butyrate, vinyl isobutyrate, vinyl pivalate, vinyl caproate, vinyl versalate, vinyl laurate, vinyl stearate, vinyl cyclohexyl carbonate, vinyl benzoate, and para-t-butyl vinyl benzoate; alkyl vinyl ethers such as methyl vinyl ether, ethyl vinyl ether, butyl vinyl ether, and cyclohexyl vinyl ether; and non-fluorine-based olefins such as ethylene, propylene, n-butene, and isobutene. These can be used alone or in combination of two or more.

A method for producing the curable functional group-containing fluorine polymer is not particularly limited, and a known method can be used. To be more specific, for example, by polymerizing each of the components described above by using a known polymerization initiator or the like, the curable functional group-containing fluorine polymer can be obtained.

The curable functional group-containing fluorine polymer includes a structure unit based on the fluorine-containing polymerizable monomer and a structure unit based on the curable functional group-containing copolymerizable monomer. Preferably, the curable functional group-containing fluorine polymer includes a structure unit based on the fluorine-containing polymerizable monomer, and a structure unit based on at least one kind of monomer selected from the group consisting of hydroxyl group-containing copolymerizable monomer, carboxyl group-containing copolymerizable monomer, amino group-containing copolymerizable monomer, and silyl group-containing copolymerizable monomer. More preferably, the curable functional group-containing fluorine polymer includes a structure unit based on the fluorine-containing polymerizable monomer and a structure unit based on the hydroxyl group-containing copolymerizable monomer and/or the carboxyl group-containing copolymerizable monomer.

In the curable functional group-containing fluorine polymer, the molar ratio of the structure unit based on the fluorine-containing polymerizable monomer with respect to the total amount of the curable functional group-containing fluorine polymer is, for example, 80 mol % or more, preferably 90 mol % or more, and for example, 99 mol % or less, preferably 98 mol % or less. The molar ratio of the structure unit based on the curable functional group-containing copolymerizable monomer with respect to the total amount of the curable functional group-containing fluorine polymer is, for example, 1 mol % or more, preferably 2 mol % or more, and for example, 20 mol % or less, preferably 10 mol % or less.

The content of the curable functional group contained in the fluorine polymer is preferably the same as the molar ratio of the structure unit based on the curable functional group-containing copolymerizable monomer. To be specific, the content of the curable functional group with respect to the total amount of the curable functional group-containing fluorine polymer is, for example, 1 mol % or more, preferably 2 mol % or more, and for example, 20 mol % or less, preferably 10 mol % or less.

The content of the curable functional group can be calculated by appropriately using NMR, FT-IR, elemental analysis, fluorescent X-ray analysis, and neutralization titration in combination in accordance with the type of the monomer.

To be specific, examples of the curable functional group-containing fluorine polymer include curable functional group-containing tetrafluoroethylene (TFE) polymer, curable functional group-containing chlorotrifluoroethylene (CTFE) polymer, curable functional group-containing vinylidene fluoride (VdF) polymer, and curable functional group-containing fluoroalkyl (meth)acrylate (AFAE) polymer.

Examples of the curable functional group-containing TEE polymer include copolymer of TFE/isobutylene/hydroxybutyl vinyl ether/and if necessary, another monomer; copolymer of TFE/vinyl versatate/hydroxybutyl vinyl ether/and if necessary, another monomer; and copolymer of TFE/VdF/hydroxybutyl vinyl ether/and if necessary, another monomer. These can be used alone or in combination of two or more.

As the curable functional group-containing TFE polymer, preferably, a copolymer of TFE/isobutylene/hydroxybutyl vinyl ether/and if necessary, another monomer and a copolymer of TFE/vinyl versatate/hydroxybutyl vinyl ether/and if necessary, another monomer are used.

A commercially available product can be also used as the curable functional group-containing TFE polymer, and examples thereof include ZEFFLE (registered trademark) GK series (manufactured by DAIKIN INDUSTRIES, LTD.).

An example of the curable functional group-containing CTFE polymer includes a copolymer of CTFE/hydroxybutyl vinyl ether/and if necessary, another monomer. These can be used alone or in combination of two or more.

A commercially available product can be also used as the curable functional group-containing CTFE polymer, and examples thereof include LUMIFLON (registered trademark) series (manufactured by ASAHI GLASS CO., LTD.), FLUONATE (registered trademark) series (manufactured by DIC CORPORATION), CEFRAL COAT (registered trademark) series (manufactured by CENTRAL GLASS CO., LTD.), and ZAFLON (registered trademark) series (manufactured by TOAGOSEI CO., LTD.).

An example of the curable functional group-containing VdF polymer includes a copolymer of VdF/TFE/hydroxybutyl vinyl ether/and if necessary, another monomer. These can be used alone or in combination of two or more.

A commercially available product can be also used as the curable functional group-containing VdF polymer.

An example of the curable functional group-containing AFAE polymer includes a copolymer of fluoroalkyl (meth)acrylate represented by $CF_3CF_2(CF_2CF_2)_n CH_2CH_2OCOCH=CH_2$ (n=mixture of 3 and 4)/2-hydroxyethyl methacrylate/stearyl acrylate/and if necessary, another monomer. These can be used alone or in combination of two or more.

A commercially available product can be also used as the curable functional group-containing AFAE polymer, and examples thereof include UNIDYNE (registered trademark) series (manufactured by DAIKIN INDUSTRIES, LTD.), Ftone (registered trademark) series (manufactured by DAIKIN INDUSTRIES, LTD.), and Zonyl (registered trademark) series (manufactured by DuPont.).

These curable functional group-containing fluorine polymers can be used alone or in combination of two or more.

As the curable functional group-containing fluorine polymer, preferably, in view of improvement of pigment (titanium oxide (described later)) dispersibility, weather resistance, copolymerizability, chemical resistance, and moisture resistance, a curable functional group-containing TFE polymer is used.

In the curable composition, the content ratio of the curable functional group-containing fluorine polymer is appropriately adjusted so as to be within a range to be described later.

The alkoxysilane is a compound that has a Si atom, preferably 1 to 4, more preferably 1 to 3, particularly preferably 2 to 3 (hereinafter, referred to as x piece) of alkoxy groups (straight-chain, branched, or cyclic alkoxy groups) to be bonded to the Si atom, and 4-x piece of alkyl groups (straight-chain, branched, or cyclic alkyl groups).

The alkoxysilane has a functional group including at least one kind of element selected from the group consisting of a group 15 element to a group 16 element of the periodic table (excluding oxygen). Preferably, the alkoxy group and/or the alkyl group to be bonded to the Si atom have/has a functional group.

The group consisting of a group 15 element to a group 16 element of the periodic table (excluding oxygen) is the group consisting of a group 15 element to a group 16 element of the periodic table (excluding oxygen) (in accordance with IUPAC Periodic Table of the Elements (version date 8 Jan. 2016 (hereinafter, the same)). To be specific, examples thereof include elements of the group 15 element such as nitrogen (N), phosphorus (P), arsenicum (As), antimony (Sb), and bismuth (Bi) and elements of the group 16 element excluding oxygen such as sulfur (S), selenium (Se), tellurium (Te), and polonium (Po). Preferably, nitrogen (N) and sulfur (S) are used. A preferable example of the element of the group 15 element is nitrogen (N), and a preferable example of the element of the group 16 element is sulfur (S).

These groups consisting of a group 15 element to a group 16 element of the periodic table (excluding oxygen) can be used alone or in combination of two or more.

In other words, in the functional group contained in the alkoxysilane, at least one kind of element of the group consisting of a group 15 element to a group 16 element of the periodic table (excluding oxygen) may be contained, or two or more thereof may be contained.

Also, "excluding oxygen" does not deny that the oxygen is contained in the functional group. That is, as long as the functional group contains at least one kind of element of the group consisting of a group 15 element to a group 16 element of the periodic table (excluding oxygen), the oxygen may be further contained as another element. Preferably, the functional group does not contain the oxygen.

Furthermore specifically, though not particularly limited, examples of the functional group include primary amino group (—$NH_2$), secondary amino group (—NH—), mercapto group (—SH), and isocyanate group (—NCO). These functional groups can be used alone or in combination of two or more. As the functional group, preferably, a primary amino group (—$NH_2$), a secondary amino group (—NH—), and a mercapto group (—SH) are used.

When the functional group is at least one kind of functional group selected from the group consisting of primary amino group, secondary amino group, and mercapto group, a curing coating film having excellent glossiness and furthermore, having excellent solvent resistance, adhesive properties, and low yellowing degree (low b value) can be obtained, and also a curable composition having excellent storage stability can be obtained.

To be specific, examples of the alkoxysilane having the functional group include alkoxysilane having a primary amino group, alkoxysilane having a secondary amino group, alkoxysilane having both a primary amino group and a secondary amino group, and alkoxysilane having a mercapto group.

When the curable composition contains the alkoxysilane, an occurrence or cloudiness possibly derived from a phase separation can be suppressed. It is considered that the phase separation is suppressed because the carbonyl group, the ester group, or the like of the above-described blocking agent (blocking agent having an O=C—CH—C=O skeleton) reacts with the above-described functional group (amino group, mercapto group, or the like) of the alkoxysilane, or those have strong mutual interaction.

To be more specific, the alkoxysilane having a primary amino group is an alkoxysilane having a primary amino group and without having a secondary amino group, and examples thereof include 3-aminopropylmethyldimethoxysilane and 3-aminopropyltrimethoxysilane.

The alkoxysilane having a secondary amino group is an alkoxysilane having a secondary amino group and without having a primary amino group, and an example thereof includes N-phenyl-3-aminopropyltrimethoxysilane.

Examples of the alkoxysilane having both a primary amino group and a secondary amino group include N-β(aminoethyl)γ-aminopropyltrimethoxysilane (also known as N-2-(aminoethyl)-3-aminopropyltrimethoxysilane), N-β(aminoethyl)γ-aminopropyltriethoxysilane (also known as N-2-(aminoethyl)-3-aminopropyltriethoxysilane), N-β(aminoethyl)γ-aminopropylmethyldimethoxysilane (also known as N-2-(aminoethyl)-3-aminopropylmethyldimethoxysilane), and N-β(aminoethyl)γ-aminopropylmethyldiethoxysilane (also known as N-2-(aminoethyl)-3-aminopropylmethyldiethoxysilane).

Examples of the alkoxysilane having a mercapto group include 3-mercaptopropylmethyldimethoxysilane and 3-mercaptopropymethoxysilane.

These alkoxysilanes can be used alone or in combination of two or more.

As the alkoxysilane, in view of adhesive properties, preferably, an alkoxysilane having a primary amino group and an alkoxysilane having both a primary amino group and a secondary amino group are used, and in view of low yellowing degree, more preferably, an alkoxysilane having a primary amino group is used.

When the alkoxysilane having a primary amino group or the alkoxysilane having both a primary amino group and a secondary amino group is contained in the curable composition, the amino group thereof reacts with the isocyanate group (isocyanate group that is regenerated by elimination of the blocking agent) of the blocked isocyanate, so that a urea bond may be formed. In the heating (baking) or the like to be described later, silyl cross-linking reaction by water occurs, so that a structure unit of Si—O—Si may be formed.

In the curable composition, the content ratio of the alkoxysilane is appropriately adjusted so as to be within a range to be described later.

The curable composition can further contain a titanium oxide as an arbitrary component. Preferably, the curable composition contains the titanium oxide.

The titanium oxide is white pigment, and examples thereof include titanium monoxide (TiO), dititanium trioxide ($Ti_2O_3$), titanium dioxide ($TiO_2$), and titanium peroxide ($TiO_3, nH_2O$). Preferably, titanium dioxide is used.

Examples of the titanium dioxide include crystalline titanium dioxide such as anatase-type, rutile-type, and brookite-type. Preferably, a rutile-type titanium dioxide is used. The titanium dioxide may be produced by any one of the production method of a sulfuric acid method, a chlorine method, and a gas phase method, or may be, for example, treated with a known processing agent including Al, Si, Zn, or the like. Furthermore, a weatherproof grade is preferably used.

These titanium oxides can be used alone or in combination of two or more.

In the curable composition, the content ratio of the titanium oxide is appropriately adjusted so as to be within a range to be described later.

The curable composition can be prepared by mixing the blocked isocyanate, the curable functional group-containing fluorine polymer, and the alkoxysilane (furthermore, the titanium oxide as needed) described above.

The mixing method is not particularly limited, and for example, collective mixing or sequential mixing may be used. For example, the curable functional group-containing fluorine polymer and the titanium oxide are mixed in advance, and thereafter, the obtained mixture can be mixed with the blocked isocyanate and the alkoxysilane.

In the curable composition, the content ratio (in terms of solid content) of each of the components is shown in the following.

That is, the content ratio (in terms of solid content) of the blocked isocyanate with respect to the total amount of the solid content of the curable composition is, for example, 1 mass % or more, preferably 5 mass % or more, and for example, 50 mass % or less, preferably 30 mass % or less.

The content ratio (in terms of solid content) of the curable functional group-containing fluorine polymer with respect to the total amount of the solid content of the curable composition is, for example, 20 mass % or more, preferably 30 mass % or more, and for example, 95 mass % or less, preferably 90 mass % or less.

The content ratio (in terms of solid content) of the alkoxysilane with respect o the total amount of the solid content of the curable composition is, for example, 0.1 mass % or more, preferably 0.3 mass % or more, and for example, 8 mass % or less, preferably 5 mass % or less.

The content ratio (in terms of solid content) of the titanium oxide with respect to the total amount of the solid content of the curable composition is, for example, 0 mass % or more, preferably 10 mass % or more, and for example, 70 mass % or less, preferably 50 mass % or less.

When the content ratio of each of the components in the curable composition is within the above-described range, a curing coating film having excellent glossiness and furthermore, having excellent solvent resistance, adhesive properties, and low yellowing degree (low b value) can be obtained.

The mass ratio of the blocked isocyanate with respect to 100 parts by mass of the total amount of the blocked isocyanate and the curable functional group-containing fluorine polymer is, for example, 2 parts by mass or more, preferably 5 parts by mass or more, and for example, 40 parts by mass or less, preferably 20 parts by mass or less. The mass ratio of the curable functional group-containing fluorine polymer with respect to 100 parts by mass of the total amount of the blocked isocyanate and the curable functional group-containing fluorine polymer is, for example, 60 parts by mass or more, preferably 80 parts by mass or more, and for example, 98 parts by mass or less, preferably 95 parts by mass or less.

When the mass ratio of the blocked isocyanate and the curable functional group-containing fluorine polymer is within the above-described range, a curing coating film having particularly excellent glossiness can be obtained.

The molar ratio (curable functional group isocyanate group) of the curable functional group of the curable functional group-containing fluorine polymer with respect to the isocyanate group (that is, the latent isocyanate group that is blocked by the blocking agent) of the isocyanate compound in the blocked isocyanate is, 0.5 or more, preferably 0.9 or more, and 10 or less, preferably 5 or less.

When the molar ratio (curable functional group/isocyanate group) of the curable functional group of the curable functional group-containing fluorine polymer with respect to the isocyanate group of the isocyanate compound in the blocked isocyanate is within the above-described range, a curing coating film having particularly excellent glossiness can be obtained. Meanwhile, when the molar ratio (curable functional group/isocyanate group) is above or below the above-described range, the glossiness of the curing coating film may be insufficient. This is because that the reactivity and the compatibility of the blocked isocyanate with the curable functional group-containing fluorine polymer may be insufficiently controlled.

Furthermore, in the curable composition, the content ratio of the alkoxysilane with respect to 100 parts by mass of the total amount of the blocked isocyanate and the curable functional group-containing fluorine polymer is, for example, 0.2 parts by mass or more, preferably 0.3 parts by mass or more, more preferably 0.35 parts by mass or more, further more preferably 0.4 parts by mass or more, and for example, 8 parts by mass or less, preferably 7 parts by mass or less, more preferably 6 parts by mass or less.

When the content ratio of the alkoxysilane is within the above-described range, a curing coating film having excellent glossiness and furthermore, having excellent solvent resistance and low yellowing degree can be obtained.

Meanwhile, when the content ratio of the alkoxysilane is below the above-described range, the glossiness, the solvent resistance, or the like of the curing coating film are insufficient. This is because that the reactivity of the alkoxysilane with another component (mainly blocked isocyanate) is insufficient, so that surface deformation occurs to cause a decline in the glossiness, and furthermore, cross-linking is insufficient and the solvent resistance is reduced.

When the content ratio of the alkoxysilane is above the above-described range, the glossiness and the yellowing resistance are insufficient. This is because that surface smoothness (glossiness) is reduced and coloring (high yellowing) is developed by the effect of the excessive progress of the reaction of the alkoxysilane with another component (mainly the blocked isocyanate) and an occurrence of side reaction.

In the curable composition, the content ratio of the titanium oxide used as needed with respect to 100 parts by mass of the curable functional group-containing fluorine polymer is, for example, 0 parts by mass or more and, for example, 200 parts by mass or less, preferably 100 parts by mass or less. Meanwhile, when the titanium oxide is used, the ratio is preferably 20 parts by mass or more.

When the content ratio of the titanium oxide is within the above-described range, a curing coating film having excellent glossiness and furthermore, having excellent solvent resistance, adhesive properties, and low yellowing degree (low b value) can be obtained.

Meanwhile, when the content ratio of the titanium oxide is above the above-described range, the glossiness is reduced. This is because that the resin component (blocked isocyanate, curable functional group-containing fluorine polymer, alkoxysilane, or the like) cannot totally cover the titanium oxide, so that the surface smoothness is reduced.

The curable composition can further contain an additive as needed. Examples thereof include antioxidants and in addition, curing accelerators, ultraviolet absorbers, light stabilizers, fillers, silane coupling agents, epoxy resins, catalysts, coating improving agents, leveling agents, nucleating agents, lubricants, mold release agents, defoaming agents, thickeners, plasticizers, surfactants, pigments (excluding titanium oxide), dispersing agents, dyes, organic or inorganic fine particles, fungicides, flame retardants, adhesion improving agents, and flatting agents.

Examples of the antioxidant include phenol antioxidants such as pentaerythritoltetrakis[3-(3,5-di-t-butyl-4-hydroxyphenyl)propionate], octadecyl-3-(3,5-di-t-butyl-4-hydroxyphenyl)propionate, and 3,9-bis[2-[3-(3-t-butyl-4-hydroxy-5-methylphenyl)-propionyloxy]-1,1,-dimethylethyl]-2,4,8,10-tetraoxa-spiro[5,5]undecane; phosphite antioxidants such as triphenylphosphite, tris(2-ethylhexyl)phosphite, and tris(tridecyl)phosphite; and phosphate antioxidants such as dibutylphosphate and 2-ethylhexyl acid phosphate. These antioxidants can be used alone or in combination of two or more.

As the antioxidant, preferably, a phosphate antioxidant is used.

The mixing ratio of the antioxidant o particularly limited, and appropriately set in accordance with its purpose and use.

The timing of the addition of the additive is not particularly limited, and the additive may be added to each of the components (blocked isocyanate, curable functional group-containing fluorine polymer, alkoxysilane, or the like) described above in advance, may be simultaneously added at the time of the mixing of each of the components described above, or furthermore, may be separately added after the mixing of each of the components described above.

According to the curable composition and the curing agent, a curing coating film having excellent glossiness and furthermore, having excellent solvent resistance, adhesive properties, and low yellowing degree (low b value) can be obtained, and also excellent storage stability can be achieved.

As a method for obtaining the curing coating film from the curable composition, for example, the curable composition is applied to a substrate to be dried and subjected to curing reaction.

As the temperature conditions in drying and the curing reaction, the temperature is, for example, 40° C. or more, preferably 80° C. or more, and for example, 300° C. or less, preferably 200° C. or less. The duration is, for example, 30 seconds or more, and for example, 3 days or less.

In this manner, the blocking agent that is blocking the blocked isocyanate reacts with the curable functional group in the curable functional group-containing fluorine polymer, or the isocyanate group that is regenerated by elimination of the blocking agent from the blocked isocyanate reacts with the curable functional group in the curable functional group-containing fluorine polymer to cure, thereby forming a coating film. As a result, the curing coating film is obtained.

Also, the curing coating film can be aged at 20 to 300° C. for 1 minute to 30 days as needed.

The obtained curing coating film has excellent glossiness and furthermore, has excellent solvent resistance, adhesive properties, and low yellowing degree (low b value).

Thus, the curable composition and the curing agent described above are preferably used as a coating material for obtaining the curing coating film, and as an adhesive for bonding an adherend by the curing coating film (adhesive layer).

The coating material and the adhesive of the present invention contain the above-described curable composition. In other words, the above-described curable composition is used as the coating material and the adhesive.

The embodiment of the coating material and the adhesive is not particularly limited, and examples thereof include solvent-type coating material, solvent-type adhesive, aqueous coating material, aqueous adhesive, powder-type coating material, and powder-type adhesive. They are prepared by a known method. In view of easy film forming properties, curing properties, and drying properties, preferably, a solvent-type coating material and a solvent-type adhesive are used.

The solvent-type coating material and the solvent-type adhesive contain the above-described curable composition and a solvent.

An example of the solvent includes a known organic solvent. To be specific, examples thereof include esters such as ethyl acetate, butyl acetate, isopropyl acetate, isobutyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethylformamide and N,N-dimethylacetamide; aromatic hydrocarbons such as xylene, toluene, and solvent naphtha; glycol ethers such as propylene glycol methyl ether and ethyl cellosolve; diethylene glycol esters such as carbitol acetate; and aliphatic hydrocarbons such as n-pentane, n-hexane, n-heptane, n-octane, n-nonane, n-decane, n-undecane, n-dodecane, and mineral spirit. These can be used alone or in combination of two or more.

As the solvent, preferably, esters are used, more preferably, a butyl acetate is used.

In the coating material and the adhesive, the content ratio of the curable composition is not particularly limited, and in the case of the solvent-type coating material and the solvent-type adhesive, for example, the content ratio of the curable functional group-containing fluorine polymer with respect to the total amount thereof is, for example, 5 mass % or more, preferably 10 mass % or more, and for example, 95 mass % or less, preferably 70 mass % or less.

The coating material and the adhesive can further contain an additive as needed. Examples thereof include the above-described antioxidants and in addition, curing accelerators, ultraviolet absorbers, light stabilizers, fillers, silane coupling agents, epoxy resins, catalysts, coating improving agents, leveling agents, nucleating agents, lubricants, mold release agents, defoaming agents, thickeners, plasticizers, surfactants, pigments (excluding titanium oxide), dispersing agents, dyes, organic or inorganic fine particles, fungicides, flame retardants, adhesion improving agents, and flatting agents.

The timing of the addition of the additive is not particularly limited, and the additive ay be added to each of the components (curable composition, solvent, or the like) described above in advance, may be simultaneously added at the time of the mixing of each of the components described above, or furthermore, may be separately added after the mixing of each of the components described above.

According to the coating material and the adhesive, a curing coating film having excellent glossiness and furthermore, having excellent solvent resistance, adhesive properties, and low yellowing degree (low b value) can be obtained, and also excellent storage stability can be achieved.

As a method for obtaining the curing coating film from the coating material, for example, the coating material is applied to a substrate to be dried and subjected to curing reaction.

Also, as a method for bonding the substrate (adherend) by the curing coating film (adhesive layer) of the adhesive, for example, the adhesive is applied to the substrate (adherend), and another member (another adherend) is brought into contact with the applied surface (adhesive surface) thereof to be dried and subjected to curing reaction.

As the temperature conditions in drying and the curing reaction, the temperature is, for example, 40° C. or more, preferably 100° C. or more, and for example, 300° C. or less, preferably 200° C. or less. The duration is, for example, 30 seconds or more, and for example, 3 days or less.

In this manner, the blocking agent that is blocking the blocked isocyanate reacts (for example, is subjected to esterification reaction) with the curable functional group in the curable functional group-containing fluorine polymer, or the isocyanate group that is regenerated by elimination of the blocking agent from the blocked isocyanate reacts (for example, is subjected to urethane reaction) with the curable functional group in the curable functional group-containing fluorine polymer to cure, thereby forming a coating film (adhesive layer).

As a result, the curing coating film (adhesive layer) is obtained. Also, the curing coating film (adhesive layer) can be aged at 20 to 300° C. for 1 minute to 30 days as needed.

In this manner, a curing coating film (adhesive layer) having excellent glossiness and furthermore, having excellent solvent resistance, adhesive properties, and low yellowing degree (low b value) can be obtained.

In this way, the above-described curable composition is preferably used as the coating material and the adhesive.

That is, the coating material and the adhesive are required to form the curing coating film having excellent glossiness, solvent resistance, adhesive properties, and low yellowing degree (low h value) in various industrial fields. However, in the coating film containing the curable functional group-containing fluorine polymer, the titanium oxide, or the like, the solvent resistance and the surface glossiness (surface smoothness) are not sufficient.

Among all, the surface glossiness (surface smoothness) is required in view of design, and in addition, for example, in the case of the use such as a solar cell used outdoors for a long period of time, when the surface glossiness (surface smoothness) is not sufficient, the surface easily becomes dirty caused by unevenness on the surface and there are concerns about its durability.

The poor solvent resistance and the poor surface glossiness (surface smoothness) are considered to be the result from the minute phase separation caused by the weak mutual interaction of the curable functional group-containing fluorine polymer, the titanium oxide, or the like.

When the coating material and the adhesive are the solvent-type coating material and the solvent-type adhesive, respectively, a long pot life and suppression of the cloudiness possibly derived from the phase separation of both of the components are required.

That is, it is considered that when the cloudiness occurs in the coating material and the adhesive, an uneven distribution of the isocyanate component (blocked isocyanate) and the fluorine resin occurs, and the reactivity thereof is reduced, so that a decline in the solvent resistance and unevenness on the surface occur.

In this point, for example, it is found out that when the isocyanate compound having a bis(isocyanatomethyl)cyclohexane skeleton is not used, and the aliphatic polyisocyanate such as hexamethylene diisocyanate is used, the curing coating film obtained from the blocked isocyanate and the curable functional group-containing fluorine polymer has poor glossiness. As one of the reasons for this, the viscosity of the hexamethylene diisocyanate tends to be relatively low for its structure. Also, there is a possibility that the hexamethylene diisocyanate is easily crystallized for its structure, so that the surface smoothness is reduced by crystallization contraction.

In contrast, the isocyanate compound having a bis(isocyanatomethyl)cyclohexane skeleton used in the present invention tends to have high viscosity. Thus, it is considered that the above-described disadvantage can be solved.

As a preferable embodiment, when the isocyanate compound having a bisisocyanatocyclohexane structure and another isocyanate compound are used in combination, the crystallization tends to be inevitably hard to achieve, and furthermore, the isocyanate compound having a bisisocyanatocyclohexane structure has excellent compatibility with another isocyanate compound, so that there is a possibility of being capable of improving the surface smoothness.

It is found out that when the above-described isocyanate compound and the above-described specific blocking agent (blocking agent having an O=C—CH—C=O skeleton) are used in combination to serve as a blocked isocyanate, not only a pot life can be prolonged, but also the cloudiness can be suppressed because the compatibility with respect to the curable functional group-containing fluorine polymer is excellent.

In terms of these, excellent surface smoothness of the curing coating film (film, sheet, or the like including the curing coating film) obtained by using the curable composition, the coating material, and the adhesive is also considered to be the effect of the improvement of the compatibility.

Also, by the improvement of the compatibility, the reaction rate of the blocked isocyanate to the curable functional group-containing fluorine polymer is considered to be improved, so that the obtained curing coating film has excellent solvent resistance, among all, excellent solvent resistance under a high temperature environment of above 150° C.

The reason why the above-described blocked isocyanate shows excellent compatibility with respect to the curable functional group-containing fluorine polymer is not clear, and the following factor is considered.

That is, the above-described specific blocking agent (blocking agent having an O=C—CH—C=O skeleton) has a plurality of carboxyl groups near an active hydrogen. Thus, the blocked isocyanate in which the isocyanate group is blocked by the above-described blocking agent has a structure where the carboxyl group including the carboxyl group derived from the isocyanate group is extremely unevenly distributed. Even if the blocking agent is eliminated, the blocking agent is considered to be coordinated near the functional group of the curable functional group-containing fluorine polymer.

By this structure, it is considered that the affinity of the blocked isocyanate with the curable functional group-containing fluorine polymer is improved, and the cloudiness is suppressed.

In the above-described curable composition, it is considered to be a factor to suppress the cloudiness that the alkoxysilane is contained. This is because that the blocking agent reacts with the alkoxysilane or they have strong mutual interaction, so that the phase separation is suppressed and the uneven distribution of the alkoxysilane is suppressed.

In this way, the curable composition, the coating material, and the adhesive described above have a long pot life and excellent handleability. Thus, the curing coating film (sheet, film, or the like) having excellent surface smoothness (glossiness) can be formed. Furthermore, a curing coating film (sheet, film, or the like) having excellent solvent resistance, particularly excellent properties of resistance at a high temperature can be formed.

Thus, the coating material and the adhesive containing the curable composition are preferably used in various industrial fields that require glossiness, solvent resistance, adhesive properties, low yellowing degree (low b value), or the like.

As the industrial field, preferably, the solar cell field is used.

That is, the coating material and the adhesive described above are preferably used as a solar cell coating material and a solar cell adhesive, respectively. To be more specific, the coating material and the adhesive described above are preferably used as a solar cell back sheet coating material and a solar cell back sheet adhesive, respectively.

Preferably, the coating material and the adhesive described above are preferably used in the production of a sheet that requires the above-described properties.

To be specific, in the method for producing a sheet, first, the above-described coating material is applied to a substrate (application step).

The substrate is not particularly limited, and a known substrate can be used.

When the sheet is used as a coating layer, for example, a material to be coated can be used as the substrate.

The application method is not particularly limited, and a known application method such as spray coating, curtain spray coating, gravure coating, doctor coating, bar coating, roll coating, reverse roll coating, curtain coating, bead, spiral, and slot can be used.

The conditions in the application may be within a range of the regular application conditions, and the thickness of the coating film is appropriately set so that the thickness of the sheet after drying and curing is within a range to be described later.

Next, in this method, the coating material cures (curing step).

As the temperature conditions in the curing reaction, for example, when the coating material is the solvent-type coating material, the temperature is, for example, 40° C. or more, preferably 80° C. or more, and for example, 300° C. or less, preferably 200° C. or less. The duration is, for example, 30 seconds or more, and for example, 3 days or less.

Under the curing conditions, for example, when the sheet is used as a coating material of a substrate, a material that needs to avoid treatment at a high temperature (water impermeable sheet such as Si deposition PET sheet or the like) can be used as a substrate (material to be coated) without problems. That is, the sheet obtained from the above-described coating material can be, for example, preferably used as a coating material of a material that needs to avoid treatment at a high temperature (water impermeable sheet such as Si deposition PET sheet or the like) such as a back sheet of a solar cell module (solar cell back sheet).

Under the above-described temperature conditions, the blocking agent that is blocking the blocked isocyanate in the coating material reacts with the curable functional group in the curable functional group-containing fluorine polymer, or the isocyanate group that is regenerated by elimination of the blocking agent from the blocked isocyanate reacts with the curable functional group in the curable functional group-containing fluorine polymer to cure, thereby forming a coating film. As a result, a sheet made of the curing coating film is obtained.

Also, the sheet can be aged at 20 to 300° C. for 1 minute to 30 days as needed.

In view of concealment, weather resistance, chemical resistance, and moisture resistance, the thickness of the sheet is, for example, 1 μm or more, preferably 5 μm or more, more preferably 7 μm or more, further more preferably 10 μm or more. In view of lightness, the thickness thereof is, for example, 1000 μm or less, preferably 100 μm or less. Particularly preferably, the thickness thereof is 10 μm or more and 40 μm or less.

In the above-described method for producing a sheet, the coating material is directly applied to the substrate (material to be coated). Alternatively, for example, a primer layer may be formed on the substrate in advance. In this case, the coating material is applied to the substrate (material to be coated) via the primer layer.

The primer layer is not particularly limited, and can be obtained by applying a known primer coating material (for example, epoxy resin, urethane resin, acrylic resin, silicone resin, polyester resin, or the like) to the substrate by a known method to be dried.

The thickness of the primer layer is not particularly limited, and is appropriately set in accordance with its purpose and use.

The sheet thus obtained is made of the curing coating film of the above-described coating material, and thus, has excellent glossiness and furthermore, has excellent solvent resistance, adhesive properties, and low yellowing degree (low b value).

According to the above-described method for producing a sheet, a sheet made of the curing coating film having excellent glossiness and furthermore, having excellent solvent resistance, adhesive properties, and low yellowing degree (low b value) can be obtained.

Thus, the obtained sheet and the producing method thereof are preferably used in various industrial fields (among all, the back sheet of the solar cell to be described later or the like) that require glossiness, solvent resistance, adhesive properties, low yellowing degree (low b value), or the like.

To be more specific, according to the above-described coating material, compared to the conventional coating material containing the curable functional group-containing fluorine polymer, a smooth sheet having a remarkably improved pot life and low yellowing degree is obtained, while retaining properties of being hard to be yellowed. Furthermore, the obtained sheet has excellent adhesive properties with respect to the substrate and excellent solvent resistance.

Thus, the above-described coating material is preferably used as, for example, coating materials for indoor use used in indoor construction materials and interior materials and as, for example, coating materials for outdoor use used in outdoor construction materials, vehicles, aircrafts, ships, and trains.

Furthermore, the above-described coating material is extremely useful in the coating of the back sheet of the solar cell module in which conventionally, the coating material containing the curable functional group-containing fluorine polymer is preferably used.

To be more specific, when the above-described coating material is used in the coating of the back sheet of the solar cell module, the coating layer to be obtained (that is, sheet made of the curing coating film) is formed on one surface or both surfaces of the substrate such as a water impermeable sheet.

In this manner, a sheet (laminated sheet in which the water impermeable sheet and the sheet made of the curing coating film are laminated is obtained. The back sheet of the solar cell module having the water impermeable sheet and the sheet made of the curing coating film is obtained.

The sheet (laminated sheet, the back sheet of the solar cell module) is also included in the present invention.

As a method for applying the back sheet of the solar cell or the like to the solar cell module, a known method can be used, and a method disclosed in Japanese Unexamined Patent Publications No. 2013-136736 and 2014-7371 can be, for example, used.

EXAMPLES

Next, the present invention is described based on Examples and Comparative Examples. The present invention is however not limited by the following Examples. All designations of "part" or "parts" and "%" mean part or parts by mass and % by mass, respectively, unless otherwise particularly specified in the following description. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Production Example 1

Preparation of Isocyanate Solution

By using TAKENATE D-127N (solution of isocyanurate derivative of 1,3-bisisocyanatomethylcyclohexane, manufactured by Mitsui Chemicals, Inc.), a methyl isobutyl ketone (MIBK) solution (solid content of 75 mass %) of an isocyanurate derivative of a 1,3-bisisocyanatomethylcyclohexane was prepared by a solvent substitution operation (hereinafter, the obtained solution may be referred to as "D-127N (MIBK)").

Production Example 2

Preparation of Blocked Isocyanate 1

A four-neck flask sealed with nitrogen was charged with 459.13 g of D-127N (MIBK), 278.23 g of MIBK, and 254.39 g of diethyl malonate to be well mixed at a room temperature for 15 minutes. At this time, the equivalent ratio (active group/isocyanate group) of an active group (blocking group) in the blocking agent to an isocyanate group was 1.05.

Thereafter, 2.92 g of 28% sodium methylateimethanol solution (blocking reaction catalyst) was added thereto to react at 60° C. until the remaining amount of the isocyanate was 1% or less.

After the termination of the reaction, the temperature of the reaction solution was brought back to the room temperature, and 4.89 g of 2-ethylhexylacid phosphate (antioxidant) was added thereto to be mixed at the room temperature for 1 hour, thereby obtaining a blocked isocyanate 1. The mixing formulation is shown in Table 1.

Production Example 3

Preparation of Blocked Isocyanate 2

A four-neck flask sealed with nitrogen was charged with 223.57 g of D-127N (MIBK), 167.79 g of TAKENATE D-170N (isocyanurate derivative of hexamethylene diisocyanate, solid content of 100 mass %, manufactured by Mitsui Chemicals, Inc.), 336.85 g of MIBK, and 263.58 g of diethyl malonate (manufactured by Tateyamakasei Co., Ltd.) to be well mixed at the room temperature for 15 minutes. At this time, the equivalent ratio (active group/isocyanate group) of the active group (blocking group) in the blocking agent to the isocyanate group was 1.05.

Thereafter, 3.024 g of 28% sodium methylate/methanol solution (blocking reaction catalyst) was added thereto to react at 60° C. until the remaining amount of the isocyanate was 1% or less.

After the termination of the reaction, the temperature of the reaction solution was brought back to the room temperature, and 5.05 g of 2-ethylhexylacid phosphate (antioxidant) was added thereto to be mixed at the room temperature for 1 hour, thereby obtaining a blocked isocyanate 2. The mixing formulation is shown in Table 1.

Production Example 4

Preparation of Blocked Isocyanate 3

A four-neck flask sealed with nitrogen was charged with 223.71 g of D-127N (MIBK), 503.35 g of TAKENATE D-170N, 741.14 g of MIBK, and 545.14 g of diethyl malonate to be well mixed at the room temperature for 15 minutes. At this time, the equivalent ratio (active group/isocyanate group) of the active group (blocking group) in the blocking agent to the isocyanate group was 1.05.

Thereafter, 6.25 g of 28% sodium methylate/methanol solution (blocking reaction catalyst) was added thereto to react at 60° C. until the remaining amount of the isocyanate was 1% or less.

After the termination of the reaction, the temperature of the reaction solution was brought back to the room temperature, and 10.45 g of 2-ethylhexylacid phosphate (antioxidant) was added thereto to be mixed at the room temperature for 1 hour, thereby obtaining a blocked isocyanate 3. The mixing formulation is shown in Table 1.

Production Example 5

Preparation of Blocked Isocyanate 4

A four-neck flask sealed with nitrogen was charged with 225,00 g of TAKENATE D-170N, 271.08 g of MIBK, and 188.79 g of diethyl malonate to be well mixed at the room temperature for 15 minutes. At this time, the equivalent ratio (active group/isocyanate group) of the active group (blocking group) in the blocking agent to the isocyanate group was 1.05.

Thereafter, 2.17 g of 28% sodium methylate/methanol solution (blocking reaction catalyst) was added thereto to react at 60° C. until the remaining amount of the isocyanate was 1% or less.

After the termination of the reaction, the temperature of the reaction solution was brought back to the room temperature, and 3.62 g of 2-ethylhexylacid phosphate (antioxidant) was added thereto to be mixed at the room temperature for 1 hour, thereby obtaining a blocked isocyanate 4. The mixing formulation is shown in Table 1.

Production Example 6

Preparation of Blocked Isocyanate 5

A four-neck flask sealed with nitrogen was charged with 243.79 g of D-127N (MIBK), 182.85 a of D-170N, and 233.39 g of ethyl acetoacetate to be well mixed at the room temperature for 15 minutes. At this time, the equivalent ratio (active group/isocyanate group) of the active group (blocking group) in the blocking agent to the isocyanate group was 1.05.

Thereafter, 3.30 g of 28% sodium methylate/methanol solution (blocking reaction catalyst) was added thereto to react at 60° C. until the remaining amount of the isocyanate was 1% or less.

After the termination of the reaction, the temperature of the reaction solution was brought back to the room temperature, and 5.51 g of 2-ethylhexylacid phosphate (antioxidant) was added thereto to be mixed at the room temperature for 1 hour, thereby obtaining a blocked isocyanate 5. The mixing formulation is shown in Table 1.

Production Example 7

Mixing of Curable Functional Group-Containing Fluorine Polymer with Titanium Oxide A mayonnaise bottle was charged with 37.05 g of ZEFFLE GK-570 (curable functional group-containing fluorine polymer, curable function group:hydroxyl group, manufactured by DAIKIN INDUSTRIES, LTD.), 48.60 g of titanium oxide CR93 (manufactured by ISHIHARA SANGYO KAISHA, LTD.), 31.34 g of butyl acetate (solvent), and 115 g of glass bead to be gently mixed, and thereafter, the obtained mixture was well mixed for 2 hours with a paint shaker.

Next, 54.89 g of ZEFFLE GK-570 (curable functional group-containing fluorine polymer, manufactured by DAIKIN INDUSTRIES, LTD.) and 8.11 g of butyl acetate (solvent) were further added to the obtained mixture to be well mixed.

Thereafter, the glass bead was removed by filtration, thereby obtaining a mixture (white coating material varnish) of the curable functional group-containing fluorine polymer and the titanium oxide.

In the mixture, the ratio of the titanium oxide with respect to 100 parts by mass of ZEFFLE GK-570 (curable functional group-containing fluorine polymer) was 52.6 parts by mass.

Example 1

Production of Curable Composition and Coating Material

The white coating material varnish (mixture of the curable functional group-containing fluorine polymer and the titanium oxide) obtained in Production Example 7 was well mixed with the blocked isocyanate 1 obtained in Production Example 2 so that the molar ratio (curable functional group/isocyanate group) of the curable functional group (hydroxyl group) of the curable functional group-containing fluorine polymer with respect to the latent isocyanate group in the blocked isocyanate was 2.

Thereafter, KBM-903 (aminopropyltrimethoxysilane, manufactured by Shin-Etsu Chemical Co., Ltd.) was added thereto to be well mixed so that the mass ratio thereof with respect to 100 parts by mass of the total amount of the blocked isocyanate and the curable functional group-containing fluorine polymer was 1 part by mass.

Thereafter, the obtained solution was applied onto a PET film (Lumirror X10S, manufactured by TORAY INDUSTRIES, INC.) that was subjected to plasma treatment so that the film thickness after drying was 10 to 15 μm to be subjected to heat treatment at 175° C. for 2 minutes. In this manner, the coating material cured, thereby obtaining a curing coating film. As a result, a laminated sheet of the PET film and the curing coating film was obtained.

Examples 2 to 8 and Comparative Examples 1 to 3

A coating material and a curing coating film were obtained in the same manner as in Example 1, except that the type of the blocked isocyanate and the silane coupling agent was changed to that shown in Table 2. In Comparative Example 3, the blocked isocyanate was riot blended, and as a non-blocked isocyanate, TAKENATE D-127N (solution of isocyanurate derivative of 1,3-bisisocyanatomethylcyclohexane, manufactured by Mitsui Chemicals, Inc.) was used as it was.

Examples 9 to 14 and Comparative Example 4

A coating material and a curing coating film were obtained in the same manner as in Example 1, except that the added amount of KBM-903 (aminopropyltrimethoxysilane, manufactured by Shin-Etsu Chemical Co., Ltd.) was changed to that shown in Table 3.

Evaluation (1) Adhesive Properties

Each of the laminated sheets (PET film/curing coating film) obtained in Examples and Comparative Examples was used as it was to be evaluated by a cross-cut peel test (in conformity with JIS K5600-5-6 (1999)). A case where the remaining amount after peeling was 100% was evaluated as "Excellent"; a case where the remaining amount after peeling was 95% or more was evaluated as "Good", and a case where the remaining amount after peeing was below 95% was evaluated as "Bad".

(2) Solvent Resistance

A sufficient amount of absorbent cotton was wound around one end of a disposable chopstick to be sufficiently immersed in a methyl ethyl ketone (MEK).

Then, the obtained chopstick was pushed at a load of 1 kg toward the curing coating film of each of the laminated sheets (PET film/curing coating film) obtained in Examples and Comparative Examples to be subjected to rubbing for 100 times, and thereafter, the appearance thereof was observed and evaluated. A case where there was no change in appearance was evaluated as "Excellent"; a case where there was a trace of rubbing was evaluated as "Good"; a case where there was a partial peeling was evaluated as "Fair"; and a case where the curing coating film was dissolved or completely peeled was evaluated as "Bad".

(3) Glossiness

The glossiness of the curing coating film of each of the laminated sheets (PET film/curing coating film) obtained in Examples and Comparative Examples was measured with a gloss meter (VG 2000, manufactured by NIPPON DENSHOKU INDUSTRIES Co., LTD.) The incident angle was set at 60°.

(4) Yellowing Degree

The b value of the curing coating film of each of the laminated sheets (PET film/curing coating film) obtained in Examples and Comparative Examples was measured with a color difference meter (SE 2000, manufactured by NIPPON DENSHOKU INDUSTRIES Co., LTD.).

(5) Storage Stability

Each of the coating materials obtained in Examples and Comparative Examples was left to stand in a thermostatic oven at 40° C. to be left for 1 week, and thereafter, the appearance of the coating material was observed. A case where solidification was not confirmed or a case where deposits were not confirmed at the vessel wall were evaluated as "Good", and a case where solidification was confirmed was evaluated as "Bad".

TABLE 1

| No. | | Production Ex. 2 | Production Ex. 3 | Production Ex. 4 | Production Ex. 5 | Production Ex. 6 |
|---|---|---|---|---|---|---|
| Blocked Isocynate No. | | 1 | 2 | 3 | 4 | 5 |
| Mixing Formulation (parts by mass) | D-127N (MIBK) 75% solution | 459.13 | 223.57 | 223.71 | — | 243.79 |
| | (Solid Content Mass in D-127N) | 344.35 | 167.68 | 167.78 | — | 182.84 |
| | D-170N Solid Content of 100% | — | 167.79 | 503.35 | 225.00 | 182.85 |
| | MIBK | 278.23 | 336.85 | 741.14 | 271.08 | — |
| | Diethyl Malonate | 254.39 | 263.58 | 545.14 | 188.79 | — |
| | Ethyl Acetoacetate | — | — | — | — | 233.39 |
| H6XDI/HDI (mass ratio) | | 100/0 | 50/50 | 25/75 | 0/100 | 50/50 |

TABLE 2

| | No. | Ex. 1 | Ex. 2 | Ex. 3 | Ex. 4 | Ex. 5 |
|---|---|---|---|---|---|---|
| Formulation | Blocked Isocyanate No. | 1 | 1 | 1 | 1 | 1 |
| | Non-Blocked Isocyanate | — | — | — | — | — |
| | Alkoxysilane | KBM-903 | KBE-903 | KBM-602 | KBM-603 | KBM-803 |
| Evaluation | Adhesive Properties | Excellent | Excellent | Excellent | Excellent | Good |
| | Solvent Resistance | Excellent | Excellent | Excellent | Excellent | Good |
| | Glossiness (Gloss Value) | 86.4 | 85.5 | 84.9 | 85.1 | 85.7 |
| | Yellowing Degree (b Value) | 1.04 | 0.91 | 0.85 | 0.87 | 0.72 |
| | Storage Stability | Good | Good | Good | Good | Good |
| | No. | Ex. 6 | Ex. 7 | Ex. 8 | Comp. Ex. 1 | Comp. Ex. 2 | Comp. Ex. 3 |
| Formulation | Blocked Isocyanate No. | 2 | 3 | 5 | 4 | 1 | — |
| | Non-Blocked Isocyanate | — | — | — | — | — | D-127N |
| | Alkoxysilane | KBM-903 | KBM-903 | KBM-903 | KBM-903 | — | KBM-903 |

TABLE 2-continued

| Evaluation | Adhesive Properties | Good | Good | Excellent | Good | Bad | Excellent |
|---|---|---|---|---|---|---|---|
| | Solvent Resistance | Good | Fair | Good | Fair | Bad | Excellent |
| | Glossiness (Gloss Value) | 79.1 | 75.4 | 85.1 | 72.3 | 83.7 | 84.8 |
| | Yellowing Degree (b Value) | 1.02 | 1.03 | 1.5 | 0.99 | 0.77 | 0.61 |
| | Storage Stability | Good | Good | Good | Good | Good | Bad |

TABLE 3

| No. | | Ex. 9 | Ex. 10 | Ex. 11 | Ex. 12 | Ex. 13 | Ex. 14 | Comp. Ex. 4 |
|---|---|---|---|---|---|---|---|---|
| Added Amount of KBM903 (parts by mass) | | 0.25 | 0.5 | 0.75 | 1.5 | 2 | 5 | 10 |
| Evaluation | Adhesive Properties | Good | Excellent | Excellent | Excellent | Excellent | Excellent | Excellent |
| | Solvent Resistance | Fair | Good | Excellent | Excellent | Excellent | Excellent | Excellent |
| | Glossiness (Gloss Value) | 84.8 | 85.5 | 86 | 85.3 | 82.2 | 84.3 | 82.3 |
| | Yellowing Degree (b Value) | 0.71 | 0.84 | 0.92 | 1.01 | 1.09 | 1.8 | 3.9 |
| | Storage Stability | Good | Good | Good | Good | Good | Good | Good |

Details of the abbreviation of each of the components in Tables are given in the following.

D-127N: D-127N (MIBK) obtained in Production Example 1, methyl isobutyl ketone (MIBK) solution (solid content of 75 mass %) of isocyanurate derivative of 1,3-bisisocyanatomethylcyclohexane ($H_6HDI$)

D-170N: TAKENATE D-170N, isocyanurate derivative of hexamethylene diisocyanate (HDI), solid content of 100 mass %, manufactured by Mitsui Chemicals, Inc.

KBM-903: aminopropyltrimethoxysilane, manufactured by Shin-Etsu Chemical Co., Ltd.

KBE-903: aminopropyltriethoxysilane, manufactured by Shin-Etsu Chemical Co., Ltd.

KBM-602: N-2-(aminoethyl)-3-aminopropylmethyldimethoxysilane, manufactured by Shin-Etsu Chemical Co., Ltd.

KBM-603: N-2-(aminoethyl)-3-aminopropyltrimethoxysilane, manufactured by Shin-Etsu Chemical Co., Ltd.

KIM-303: 3-mercaptopropyltrimethoxysilane, manufactured by Shin-Etsu Chemical Co., Ltd.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The curable composition, the coating material, the solar cell coating material, the solar cell back sheet coating material, the adhesive, the solar cell adhesive, the solar cell back sheet adhesive, the producing method of a sheet, and the curing agent of the present invention are preferably used in coating materials for outdoor use for outdoor construction materials, vehicles, aircrafts, ships, trains, or the like.

The invention claimed is:

1. A curable composition comprising:
a blocked isocyanate, a curable functional group-containing fluorine polymer, and an alkoxysilane as essential components and a titanium oxide as an arbitrary component, wherein
the blocked isocyanate includes
a blocked isocyanate in which an isocyanate group of an isocyanate compound having a bis(isocyanatomethyl) cyclohexane skeleton is blocked by a blocking agent having an O=C—CH—C=O skeleton;
the alkoxysilane has a functional group that is at least one kind of functional group selected from the group consisting of a primary amino group, a secondary amino group and a mercapto group;
the molar ratio (curable functional group/isocyanate group) of the curable functional group of the curable functional group-containing fluorine polymer to the isocyanate group of the isocyanate compound in the blocked isocyanate is 0.5 to 5;
the content ratio of the alkoxysilane with respect to 100 parts by mass of the total amount of the blocked isocyanate and the curable functional group-containing fluorine polymer is 0.2 to 8 parts by mass;
the content ratio of the titanium oxide with respect to 100 parts by mass of the curable functional group-containing fluorine polymer is 0 to 200 parts by mass, and
the curable functional group-containing fluorine polymer contains a hydroxyl group- containing fluorine polymer.

2. The curable composition according to claim 1, wherein the blocking agent is a malonic acid ester derivative and/or an acetoacetic acid ester derivative.

3. A coating material comprising:
the curable composition according to claim 1.

4. A solar cell coating material comprising:
the curable composition according to claim 1.

5. A solar cell back sheet coating material comprising:
the curable composition according to claim 1.

6. An adhesive comprising:
the curable composition according to claim 1.

7. A solar cell adhesive comprising:
the curable composition according to claim 1.

8. A solar cell back sheet adhesive comprising:
the curable composition according to claim 1.

9. A method for producing a sheet comprising the steps of:
applying the coating material according to claim 3 to a substrate and curing the coating material.

10. The curable composition according to claim 1, wherein
the alkoxysilane comprises at least one selected from the group consisting of aminopropyltrimethoxysilane, aminopropyltriethoxysilane, N-2-(aminoethyl)-3-aminopropylmethyldimethoxysilane, N-2-(aminoethyl)-3- aminopropyltrimethoxysilane and 3-mercaptopropyltrimethoxy silane.

11. The curable composition according to claim 1, wherein
the content ratio of the alkoxysilane with respect to 100 parts by mass of the total amount of the blocked isocyanate and the curable functional group-containing fluorine polymer is 0.25 to 5 parts by mass.

* * * * *